United States Patent [19]

Tiemann

[11] 4,259,597
[45] Mar. 31, 1981

[54] CHARGE TRANSFER SIGNAL PROCESSING APPARATUS

[75] Inventor: Jerome J. Tiemann, Schenectady, N.Y.

[73] Assignee: General Electric Company, Schenectady, N.Y.

[21] Appl. No.: 105,758

[22] Filed: Dec. 20, 1979

[51] Int. Cl.$^3$ .................. G11C 19/28; H01L 29/78; H03H 15/02

[52] U.S. Cl. ........................ 307/221 D; 357/24; 333/165

[58] Field of Search ............... 357/24; 307/221 D; 333/165

[56] References Cited

U.S. PATENT DOCUMENTS

| | | | |
|---|---|---|---|
| 4,163,957 | 8/1979 | Knauer et al. | 307/221 D |
| 4,188,597 | 2/1980 | Knauer | 307/221 D |

OTHER PUBLICATIONS

Knauer et al., "Parallel-in/Serial-out: A New Approach for CCD Transversal Filters", Electronics Letters, vol. 13, (Mar. 3, 1977), pp. 126–127.

Primary Examiner—Gene M. Munson
Attorney, Agent, or Firm—Julius J. Zaskalicky; James C. Davis, Jr.; Marvin Snyder

[57] ABSTRACT

A filter utilizing charge transfer devices for providing recursive transfer functions is described. The filter includes a circular charge transfer shift register having an even number N of stages, greater than two, and first and second linear charge transfer shift registers. A composite stage of the first linear shift register is coupled to the $N^{th}$ stage of the circular shift register through a first gating means. A composite stage of the second shift register is coupled to the

$$\left(\frac{N}{2}\right)^{th}$$

stage of the circular shift register through a second gating means. A first sequence of packets of charge is applied to the first shift register, and a second sequence of packets is applied to the second shift register. All three shift registers are clocked at the same frequency. At the end of each clocking cycle the first gating means is operative to combine the charge stored in the $N^{th}$ stage of the circular shift register and the composite stage of the first linear shift register and to divide the combined charge into a first part contained in the composite stage of the first linear shift register from which it is clocked out and sensed, and a second part which is retained in the circular shift register. Similarly, the second gating means is operative at the end of each clocking cycle to combine the charge stored in the $$\left(\frac{N}{2}\right)^{th}$$

stage of the circular stage register and the composite stage of the second linear shift register and to divide the combined charge into a first part contained in the composite stage of the second linear shaft register from which it is clocked out and sensed, and a second part that is retained in the circular shift register.

8 Claims, 7 Drawing Figures

CHARGE TRANSFER SIGNAL PROCESSING APPARATUS

The present invention relates in general to charge transfer signal processing apparatus and more particularly to such apparatus for providing recursive transfer functions.

This application is relates to patent application Ser. No. 105,757, filed concurrently herewith and assigned to the assignee of the present invention.

An object of the present invention is to provide sampled data filter apparatus which provides impulse responses of infinite duration.

Another object of the present invention is to provide sampled data filter apparatus in which both the input and output thereof are packets of charge.

Another object of the present invention is to provide sampled data filter apparatus with essentially complete isolation between the output thereof and the clock voltages needed to store and transfer charge packets therein.

Another object of the present invention is to provide sampled data filter apparatus of improved linearity.

A further object of the present invention is to provide sampled data filter apparatus which is capable of operation at extremely high frequencies.

In carrying out the present invention in one illustrative embodiment thereof there is provided a substrate of semiconductor material having a major surface. A circular shift register having N stages is provided with N being an even number greater than two, each stage including a respective first charge storage cell adjacent the major surface of the substrate. A first means is provided for transferring packets of charge in each of the first charge storage cells of the circular shift register from one first charge storage cell to the respective next first storage cell in one direction and at one frequency. A first charge transfer and storage means including a first charge storage cell adjacent the major surface of the substrate is provided. A second means is provided for sequentially transferring at the aforementioned one frequency each of the packets of charge of the first sequence of packets of charge to the first charge storage cell of the first transfer and storage means. The first and second means are synchronized to provide storage of charge packets in the first charge storage cell of the first charge transfer and storage means and the first charge storage cell of the circular shift register over a common interval of time, recurrent at the aforementioned one frequency. A first gating means is provided for combining the charge packet in the first charge storage cell of the first charge transfer and storage means with the charge packet in the first charge storage cell of the $N^{th}$ stage of the circular shift register during each of the common intervals of time and for dividing the combined packet of charge into two parts, a first part of the combined packet being stored in the first charge storage cell of the first charge transfer and storage means, and a second part of the combined packet being stored in the aforementioned first charge storage cell of the $N^{th}$ stage of the circular shift register. The first part of the combined packet is a fixed fraction of the combined charge packet. The second part of the combined packet is another fixed fraction of the combined charge packet. Means are provided for transferring at the aforementioned one frequency each first part of a respective combined packet of charge out of the first charge storage cell of the first charge storage and transfer means.

A second charge transfer and storage means including a first charge storage cell adjacent the major surface of the substrate is provided. A second sequence of packets of charge is provided. A third means is provided for sequentially transferring at the aforementioned one frequency each of the packets of charge of the second sequence of packets of charge to the first charge storage cell of the second charge transfer and storage means. The first and third means being synchronized to provide storage of charge packets in the first charge storage cells of the second charge transfer and storage means and of said circular shift register over a common interval of time, recurrent at the aforementioned one frequency. A second gating means is provided for combining the charge packet in the first charge storage cell of the second charge transfer and storage means with the charge packet in the first charge storage cell of the $$\left(\frac{N}{2}\right)^{th}$$

stage of the circular shift register during each of the common intervals of time and for dividing the combined packet of charge into two parts, a first part being stored in the first charge storage cell of the second charge transfer and storage means and a second part being stored in the first charge storage cell of the $$\left(\frac{N}{2}\right)^{th}$$

stage of the circular shift register. The first part is the aforementioned fixed fraction of the combined charge packet. Means are provided for transferring at the aforementioned one frequency each first part of a respective combined packet of charge out of the first charge storage cell of the second charge storage and transfer means. Means are provided for deriving an output signal consisting of a series of samples, each of which represents the difference of corresponding charge packets recovered from the second charge transfer and storage means and from the third charge transfer and storage means.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Reference is now made to FIGS. 1-4 which show apparatus 10 in accordance with the present invention. The apparatus 10 includes a closed ended or circular charge transfer shift register 11, conveniently shown as having eight stages, formed on a common substrate 12 of semiconductor material having a major surface 13. Each stage of the shift register 11 includes a respective first charge storage cell 14 adjacent the major surface 13. The first charge storage cells of the $N^{th}$ stage ($8^{th}$ stage) and the $$\left(\frac{N}{2}\right)^{th}$$

stage ($4^{th}$ stage) are composite storage cells and specifically designated as cells 14a and 14b, respectively. The packets of charge stored in each of the first charge storage cells 14 of the circular shift register are shifted or transferred to a respective adjacent first charge storage cell 14 in one direction at a preset frequency, referred to as the clocking frequency $f_c$. The apparatus 10 also includes a first linear shift register 15 of several stages, conveniently shown as three stages, formed on the substrate 12, each stage including a respective first charge storage cell 16 adjacent the major surface 13. The first charge storage cell of the first stage of the first linear shift register is a composite storage cell and is specifically designated as cell 16a. Each of a first sequence $Q^+{}_n$ of packets of charge are introduced serially or in sequence into the first charge storage cell 16a of the first stage of the first linear shift register 15 and each is altered in a manner which will be described below and thereafter is transferred out at the aforementioned frequency $f_c$. The apparatus additionally includes a second linear shift register 17 of several stages, conveniently shown as three stages, formed on the substrate 12, each stage including a respective first charge storage cell 18 adjacent the major surface 13. The first charge storage cell of the first stage of the second linear shift register 17 is also a composite storage cell and is specifically designated as cell 18a. Each of a second sequence $Q^-{}_{in}$ of packets of charge is introduced serially or in sequence into the first charge storage cell 18a of the first stage of the second linear shift register 17 and each is altered in a manner which will also be described below, and thereafter each is transferred out at the aforementioned frequency $f_c$. At the output of the first linear shift register 15 a first output sequence $Q^+{}_{out}$ of charge packets is obtained and at the output of the second linear shift register 17 a second output sequence $Q^-{}_{out}$ of charge packets is obtained.

Figure 1:
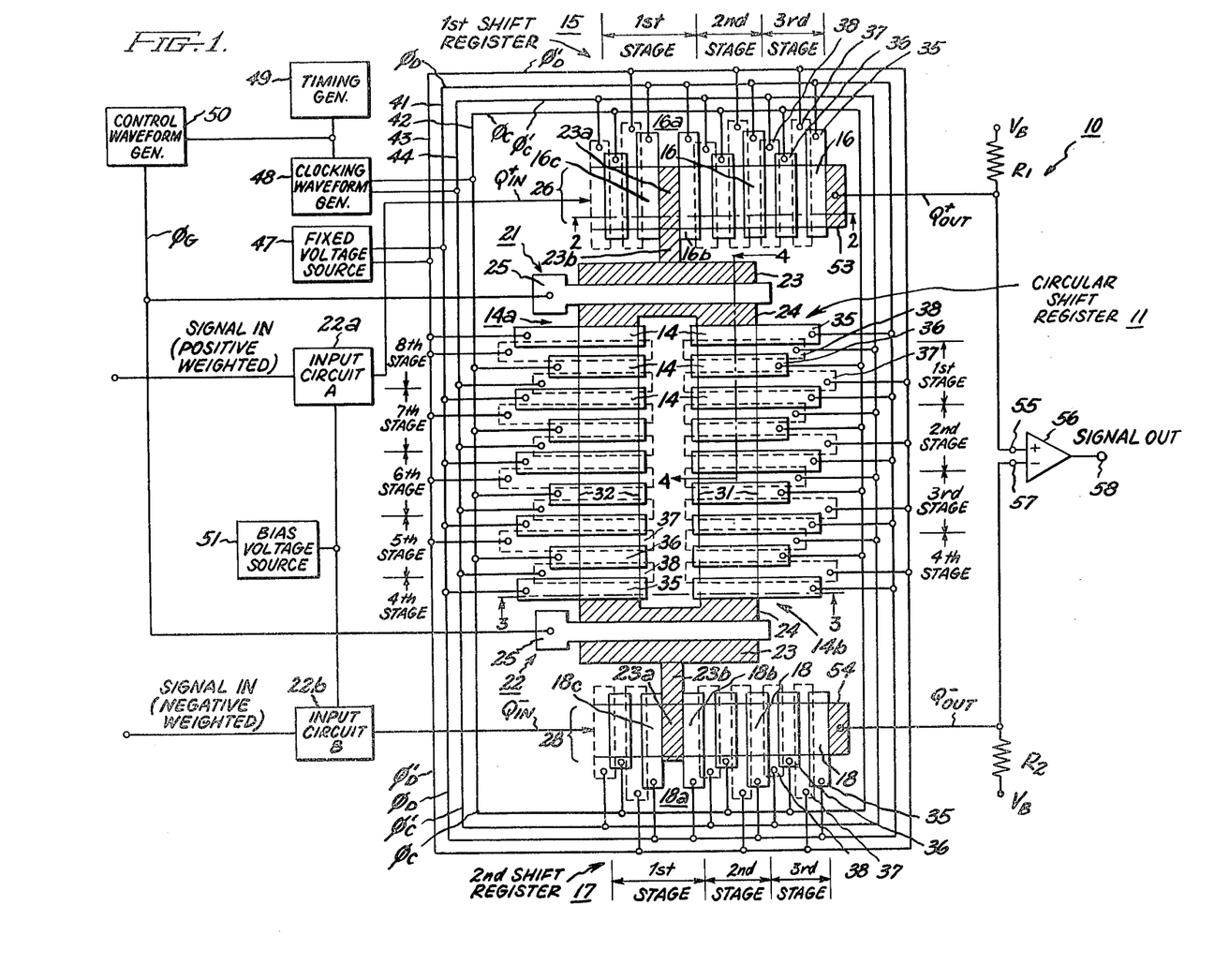
FIG. 1 is a plan view of a sampled data apparatus in accordance with the present invention.

The first charge storage cell 16a of the first stage of the first linear shift register 15 is coupled to the $N^{th}$ or eighth stage of the circular shift register 11 by a first gating stage 21. Similarly, the first charge storage cell 18a of the first stage of the second linear shift register 17 is coupled to the $$\left(\frac{N}{2}\right)^{th}$$

or fourth stage of the circular shift register 11 by a second gating stage 22, identical to the first gate stage 21. The first gating stage 21 comprises a pair of regions 23 and 24 of opposite conductivity type in the substrate 12 adjacent the major surface 13 thereof and of generally elongated outline. Adjacent linear edges of the regions 23 and 24 are parallel and form a short channel region 25a therebetween adjacent the major surface 13. A gating electrode 25 is provided insulatingly overlying and in registry with the channel region 25a. When an inversion producing voltage is applied to the gating electrode 25, a conduction channel is established in the channel region 25a between the opposite conductivity type regions 23 and 24. Second gating stage 22 is identical in structure to first gating stage 21 and corresponding elements thereof are identically designated.

The composite first charge storage cell 16a of the first stage of the linear shift register 15 comprises a first storage cell 16b having the same width as a channel region 26 of the substrate 12 included in the first linear shift register 15, a first region 23a of opposite conductivity type and of the same width as first storage cell 16b and contiguous along its width therewith, and another first storage cell 16c also of the same width as region 23a of opposite conductivity type and contiguous therewith. The opposite conductivity type region 23a is conductively connected to the opposite conductivity type region 23 by opposite conductivity type region 23b.

The composite first storage cell 14a of the $N^{th}$ (or eighth) stage of the circulating shift register 11 comprises a pair of first storage cells 14 and the region 24 of opposite conductivity type. One side of each of the pair of first storage cells is contiguous with the side of the elongated region 24 of opposite conductivity type which is opposite the side thereof adjacent the channel region 25a of the gating means 21.

The composite first charge storage cell 18a of the first stage of the linear shift register 17 comprises a first storage cell 18a having the same width as the channel region 28 of the substrate 12 included in the second linear shift register 17, a first region 23a of opposite conductivity type and of the same width as the first storage cell 18b and contiguous therewith along its width, and another first storage cell 18c, also of the same width as region 23a of opposite conductivity type and contiguous therewith. The opposite conductivity type region 23a is conductively connected to the opposite conductivity type region 23 by opposite conductivity type region 23b.

The composite first storage cell 14b of the $$\left(\frac{N^{th}}{2}\right)$$

or fourth stage of the circulating shift register 11 comprises a pair of first charge storage cells 14 and a region 24 of opposite conductivity type. One side of each of the pair of first storage cells is contiguous with the side of the elongated region 24 of opposite conductivity type which is opposite the side thereof adjacent the channel region 25a of the gating means 22.

While not shown, preferably the first charge storage cells 16 of the first shift register 15 should have the same storage capacity as the storage capacity of the composite storage cell 16a. Also, the first charge storage cells 18 of the second shift register should have the same storage capacity as the storage capacity of the composite storage cell 18a. Similarly, the widths of the first charge storage cells 14 of the circular shift register are set so that the storage capacity thereof is the same as the storage capacity of each of composite storage cells 14a and 14b. These requirements assures that all of the first charge storage cells will have adequate capacity to carry the charge packets delivered to them.

Figure 5:
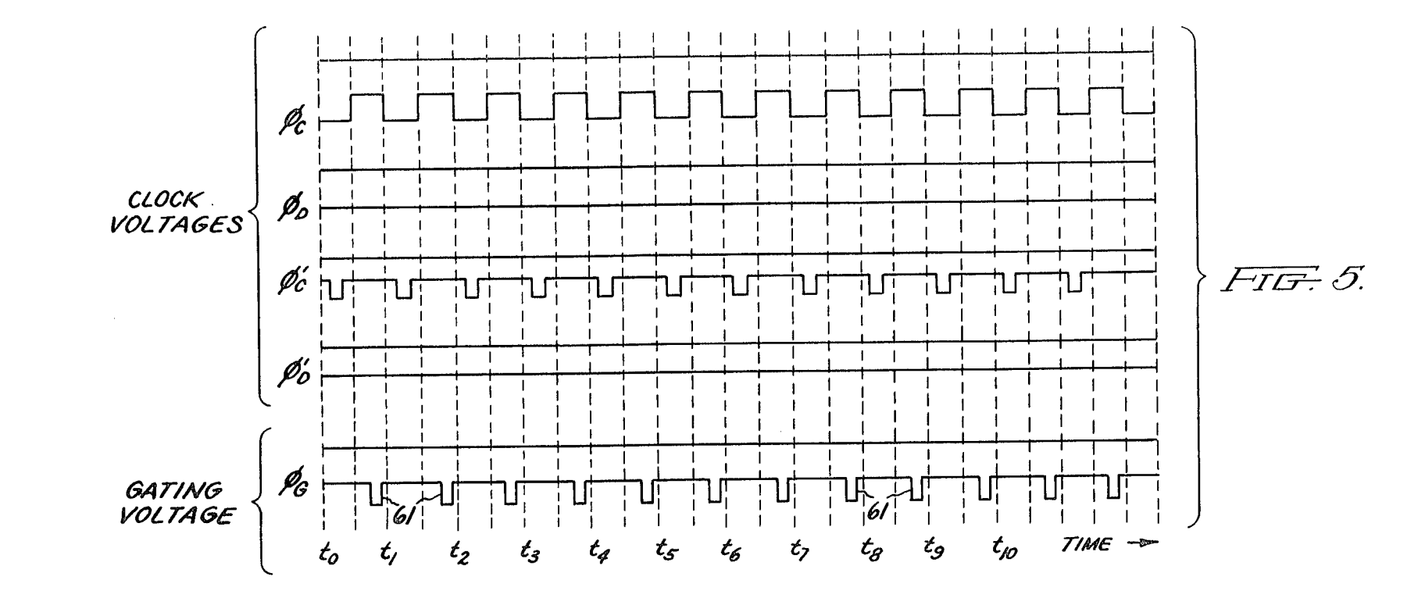
FIG. 5 is a diagram of voltage waveforms useful in describing the operation of the apparatus of FIG. 1.

The transfer of charge in the first charge storage cells of the circulating shift register 11, the first linear shift register 15 and the second linear shift register 17 are synchronized so that charge is stored in the first charge storage cells thereof over a common interval of time which is recurrent at the frequency $f_c$ of the clocking voltages utilized for storing and transfer charge in the shift registers. During each such storage interval a packet of charge is stored in the first charge storage cell 16a of the first shift register 15 and another packet of charge is stored in the first charge storage cell 14a of the circulating shift register 11. During this interval of time a pulse of gating voltage $\phi_G$, as shown in FIG. 5 and will be more fully described below, is applied to the electrode 25 to establish a conduction channel in the gating means for a short interval of time to enable the charge in the first charge storage 16a to combine or mix with the charge in the first charge storage cell 14a of the circulating shift register. The pulse of gating voltage has a duration sufficient to enable the surface potential in the first storage cell 16a to equilibrate with the surface potential in the first storage cell 14a. After the occurrence of the pulse of voltage the conduction channel connecting the two cells 16a and 14a disappears and the combined packet of charge is divided into first and second parts. The first part is stored or contained in the first charge storage cell 16a of the first shift register 15 and the second part is stored or contained in the first charge storage cell 14a of the circulating shift register 11. The first part stored in the first storage cell 16a is a first fixed fraction of the combined charge. The second part stored in the first charge storage cell 14a is a second fixed fraction of the combined charge. The first and second fixed fractions are a function of the capacitances of the first charge storage cell 16a and the first charge storage cell 14a. The manner of obtaining the fixed fractions as a function of the capacitances of the first charge storage cell 16a and the first charge storage cell 14a will be described below.

Also, over the storage interval of time charge in the first charged storage cell 14b of the fourth stage of the circulating shift register is equilibrated with the charge in the first charge storage cell 18a of the first stage of the second linear shift register in the same manner as described above in connection with first charge storage cells 16a and 14a, that is, by application of a pulse of gating voltage to the gating electrode 25 of the stage 22 during the storage interval for a sufficient time to enable equilibration of the charges in cells 18a and 14a.

The structure of the shift registers 11, 15 and 17, and the manner of transferring and storing charge in these shift registers will now be described. The circular shift register 11 is formed on semiconductor substrate 12 of N-type conductivity which has a pair of channel portions 31 and 32. Typically, the substrate may be silicon semiconductor material of suitable resistivity, for example, 4 ohm-cm. Overlying the major surface 13 of the substrate 12 is a thick insulating member 33 of the silicon dioxide having thin insulating portions 34a and 34b therein lying in registry with the respective channel portions 31 and 32. A plurality of first electrodes 35 are provided on the insulating member 33 overlying thin insulating portions 34a and 34b. Each of the first electrodes 35 is of uniform length in the direction of the length dimension of the channel portions 31 and 32, that is, in the direction of charge transfer. Each of the first electrodes 35 extends across both the thin insulating portion and the bordering thick insulating portions of the insulating member 33. A plurality of second electrodes 36 is provided on the insulating member 33 overlying the thin portions 34a and 34b. Each of the second electrodes 36 is of uniform length in the direction of the length dimension of the channel portions 31 and 32 equal to the uniform length of the first electrode 35. Each of the electrodes 36 extend across both the thin insulating portions 34a and 34b and the bordering thick insulating portions of the insulating member 33. An insulating layer 37 is provided over the electrodes 35 and 36. A plurality of first transfer electrodes 38 is provided over the insulating layer 37. Each of the first transfer electrodes 38 is insulatingly spaced between a respective second electrode 36 and an adjacent succeeding first electrode 35 and overlying these electrodes. A plurality of second transfer electrodes 39 is provided over the insulating layer 37. Each of the second transfer electrodes 39 is insulatingly spaced between a respective first electrode 35 and an adjacent succeeding second electrode 36 and overlying these electrodes. Each of the transfer electrodes 38 and 39 is substantially uniform extent in the direction of the length of the channel portions 31 and 32 and extends over the thin insulating portions 34a and 34b of the insulating member 33 as well as the bordering thick insulating portions thereof.

All of the first electrodes 35 of the shift register 11 are connected to a line 41 to which $\phi_D$ voltage is supplied from a fixed voltage source 47. All of the second electrodes 36 of the shift register 11 are connected to line 42 to which a $\phi_C$ voltage is supplied from a clocking waveform generator 48. The clocking waveform generator 48 is under the control of the timing generator 49. All of the first transfer electrodes 38 of the shift register 11 are connected to a $\phi_D'$ line 43 to which a $\phi_D'$ voltage is supplied from the fixed voltage source 47. All of the second transfer electrodes 39 of the shift register 11 are connected to a $\phi_C'$ line 44 to which a $\phi_C'$ voltage is applied from clocking waveform generator 48. A conductive layer 52 of a suitable material such as gold is eutectically bonded to the lower surface of the substrate 12 to provide a substrate contact to which the ground lines of the $\phi_D$, $\phi_D'$, $\phi_C$ and $\phi_C'$ sources are connected. The $\phi_C$, $\phi_D$, $\phi_C'$ and $\phi_D'$ voltage waveforms are shown in FIG. 5.

The first linear shift register 15 is also formed on the semiconductor substrate 12 overlying channel portion 26 thereof. A thin insulating portion 34c is provided in thick insulating member 33 lying in registry with the channel portion 26. A plurality of first electrodes 35 are provided on the insulating member 33 overlying the thin portion 34c. Each of the first electrodes 35 is of uniform length in the direction of the length dimension of the channel portion 26, that is, in the direction of charge transfer. Each of the first electrodes 35 extends across both the thin insulating portion 34c and the bordering thick insulating portions of the insulating member 33. A plurality of second electrodes 36 is provided on the insulating member 33 overlying the thin portion 34c thereof. Each of the electrodes 36 is of uniform length in the direction of the length dimension of the channel portion 26 and equal to the uniform length of a first electrode 35. Each of the electrodes 36 extend across both the thin insulating portion 34c and the bordering thick insulating portions of the insulating member 33. An insulating layer 37 is provided over the electrodes 35 and 36. A plurality of first transfer electrodes 38 is provided over the insulating layer 37. Each of the first transfer electrodes 38 is insulatingly spaced between a respective second electrode and an adjacent succeeding first electrode 35 and overlying these electrodes. A plurality of second transfer electrodes 39 is provided over the insulating layer 37. Each of the second transfer electrodes 39 is insulatingly spaced between a respective first electrode 35 and an adjacent succeeding second electrode 36 and overlying these electrodes. Each of the transfer electrodes 38 and 39 is of substantially uniform extent in the direction of the length of the channel portion 26 and extends over the thin insulating portions 34c of the insulating member 33 as well as the bordering thick insulating portions thereof.

All of the first electrodes 35 of the shift register 15 are connected to line 41 to which $\phi_D$ voltage is supplied. All of the second electrodes 36 of the shift register 11 are connected to line 42 to which $\phi_C$ voltage is supplied. All of the first transfer electrodes 38 of the shift register 11 are connected to $\phi_D'$ line 43 to which $\phi_D'$ voltage is supplied. All of the second transfer electrodes 39 of the shift register 11 are connected to $\phi_C'$ line 44 to which a $\phi_C'$ voltage is supplied.

The second linear shift register 17 is also formed on the semiconductor substrate 12 overlying channel portions 28 thereof and is identical in structure to the first linear shift register 15 and corresponding elements thereof are identically designated.

Each stage of the shift registers 11, 15 and 17 includes a $\phi_D$ storage cell (first storage cell) underlying a $\phi_D$ line 35 and a $\phi_C$ storage cell (second storage cell) underlying a $\phi_C$ line 36. The $\phi_D$ voltage (FIG. 5) applied to the $\phi_D$ line 35 is fixed. The $\phi_C$ voltage applied to the $\phi_C$ line 36 cycles between a high level and a low level above and below the $\phi_D$ voltage. When the $\phi_C$ voltage is at its high level charge transfer is enabled from a $\phi_C$ cell to a $\phi_D$ cell, and conversely when the $\phi_C$ voltage is at its low level charge transfer is enabled from a $\phi_D$ cell to a $\phi_C$ storage cell. Each stage also includes a $\phi_D'$ line 38 to which is applied a $\phi_D'$ voltage of fixed value which produces a surface potential in the substrate underlying the electrode which is smaller in absolute magnitude than the surface potential underlying a $\phi_D$ line. Each stage also includes a $\phi_C'$ electrode 39 to which is applied a $\phi_C'$ voltage having two levels. At the upper level a surface potential is produced in the substrate underlying the electrode which inhibits the transfer of charge from a $\phi_D$ storage cell to a $\phi_C$ storage cell. At the lower level a surface potential is produced enabling the transfer of charge from a $\phi_D$ storage cell to a $\phi_C$ storage cell. Thus, when the $\phi_C$ voltage is at its high level, charge is transferred from a $\phi_C$ storage cell to a $\phi_D$ storage cell, and when both the $\phi_C$ voltage and the $\phi_C'$ voltage are at their low levels charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to a next succeeding $\phi_C$ storage cell.

Input circuits 22a and 22b are provided, each for generating a respective sequence of packets of charge corresponding to a respective sequence of signal samples. A first sequence of signal samples corresponding to the positive components of an input signal sequence is applied to input circuit 22a and a second sequence of samples corresponding to the negative components of the input signal sequence is applied to the input circuit 22b. Input circuits 22a and 22b, such as referred to above, are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 51 connected to the input circuits 22a and 22b provides a fixed bias charge component to each packet of charge developed by the input circuits 22a and 22b which facilitates the transfer thereof.

The output of the input circuit 22a is applied to the first stage of the first shift register 15. The output of the input circuit 22b is applied to the first stage of the second shift register 17. Adjacent the first storage cell 16 of the third stage of shift register 15 a charge collection means in the form of a region 53 of opposite conductivity type is provided for the collection of charge flowing into the first charge storage cell of this stage. Adjacent the first storage cell 18 of the third stage of the shift register 17 a charge collection means in the form of a region 54 of opposite conductivity type is provided for the collection of charge flowing into the first charge storage cell of this stage.

An output circuit is provided for sensing the charge collected in the common collecting means 53 of the first shift register and for sensing the charge collected on the common collection means 54 of the second shift register and for producing an output which represents the difference of the sensed charges. To this end a bias voltage $V_B$ is applied to the common collection means 53 of the first shift register through a first resistance $R_1$ and also to the common collecting means 54 of the second shift register through a second resistance $R_2$ which is equal to the first resistance $R_1$. The potential of $V_B$ is set to provide a potential at the collecting means of each of the shift registers which is less than the surface potential of the empty first storage cells of the first and second shift registers. The signal appearing at 53 of the first shift register is applied to the non-inverting terminal 55 of a differential amplifier 56. The signal appearing at region 54 of the second shift register is applied to the inverting terminal 57 of the differential amplifier 56. Thus, at the output terminal 58 of the differential amplifier a signal is obtained which is the difference of the signals appearing at regions 53 and 54.

Figure 6:
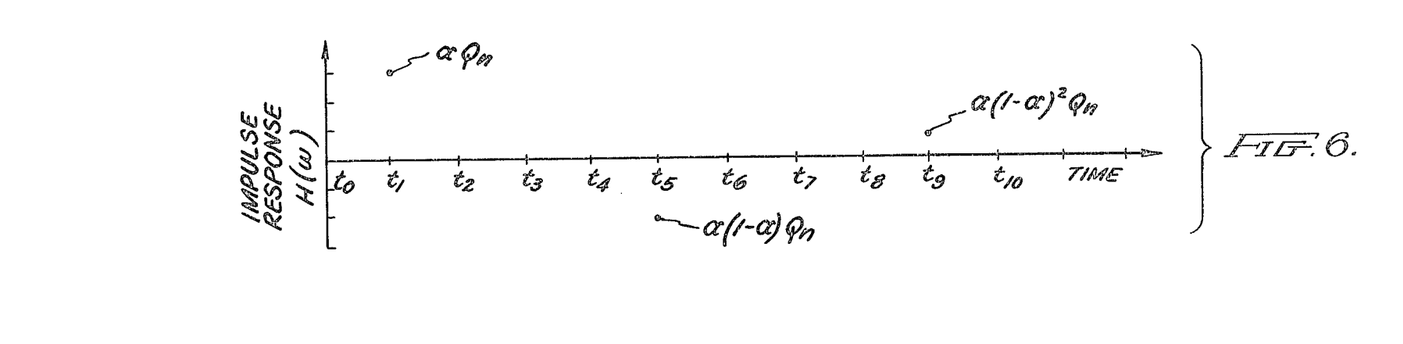
FIG. 6 is a diagram showing the impulse response of the apparatus of FIG. 1.

The operation of the apparatus of FIGS. 1-4 will now be explained in connection with the waveform diagrams of FIG. 5 and impulse response diagram of FIG. 6. Over a first clock period $t_0$-$t_1$, a unit packet of charge is transferred into the composite storage cell 16a. At the end of this clock period a pulse 61 of gating voltage $\phi_G$ from control gate waveform generator 50 is applied to gating electrode 25 of the first gating stage to cause the charge to flow into the composite storage cell 14a of the circular shift register. The pulse 61 is sufficiently long to allow the charge to equilibrate in the two cells. Upon termination of the pulse 61, a first part $\alpha Q_n$ is contained in storage cell 16a and is clocked out of the second shift register to non-inverting terminal 55 of the differential amplifier 56 from which a positive output is obtained. This is shown in FIG. 6 as charge $\alpha Q_n$ at time $t_1$. A second part designated $(1-\alpha)Q_n$ is contained in the storage cell 14a. Over the clock periods $t_1$-$t_2$, $t_2$-$t_3$, and $t_3$-$t_4$, the charge $(1-\alpha)Q_n$ is transferred successively to first, second and third stages of the circular shift register. Over the fourth clock period, $t_4$-$t_5$, the charge $(1-\alpha)Q_n$ is transferred to the fourth stage. At the end of this interval the pulse 61 of gating voltage $\phi_G$ which is applied to the gating electrode 25 of the second gating stage 22 causes the charge to flow into the composite storage cell 18a of the first stage of second linear shift register. After equilibration of charge in the storage cells 14b and 18a and upon termination of the pulse 61, a first part of the charge $\alpha(1-\alpha)Q_n$ is contained in storage cell 18a and a second part $(1-\alpha)^2Q_n$ is contained in storage cell 14b. The first part $\alpha(1-\alpha)Q_n$ is clocked out of the second shift register to inverting terminal 57 of the differential amplifier 56 from which a negative output is obtained, this is shown in FIG. 6 as charge $\alpha(1-\alpha)Q_n$ at time $t_5$. Over the next three clock periods $t_5$-$t_6$, $t_6$-$t_7$ and $t_7$-$t_8$ the charged $(1-\alpha)^2Q_n$ is transferred to the eighth stage of the circular shift register. At the end of this period the pulse 61 of gating voltage $\phi_G$ which is applied to electrode 25 of the first gating stage 21 causes the charge to flow into the composite storage cell 16a of the first stage of first linear shift register 15. After equilibration of charge in the storage cells 16a and 14a and upon termination of the pulse 61, a first part of the charge $\alpha(1-\alpha)^2Q_n$ is contained in storage cell 16a and a second part $(1-\alpha)^3Q_n$ is contained in storage cell 14a. The first part $\alpha(1-\alpha)^2Q_n$ is clocked out of the first shift register applied to the non-inverting terminal 55 of differential amplifier 56. A positive output of $\alpha(1-\alpha)^2Q_n$ is obtained at time $t_9$, as shown in FIG. 6.

Thus, the impulse response of the apparatus of FIGS. 1-4 is in the form of the Comb function $$\Sigma \, (\alpha - 1)^n \delta(t - \frac{nT}{2}),$$

where $T = NT_c$. The Comb function can be written as $$\Sigma \, e^{-at}[\delta(t - nT) - \delta(t - nT + \frac{T}{2})],$$

where the attenuation constant a is given by $$a = \frac{2f_c}{N_2} \ln(1 - \alpha)$$

Figure 2:
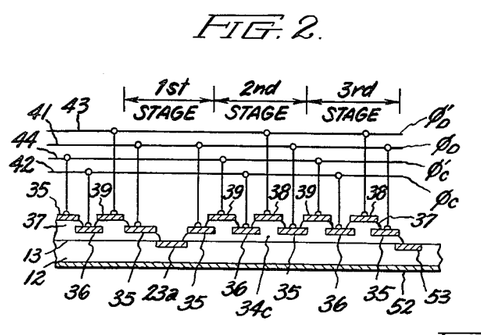
FIG. 2 is a sectional view of the apparatus of FIG. 1 taken along section lines 2—2 thereof.
Figure 3:
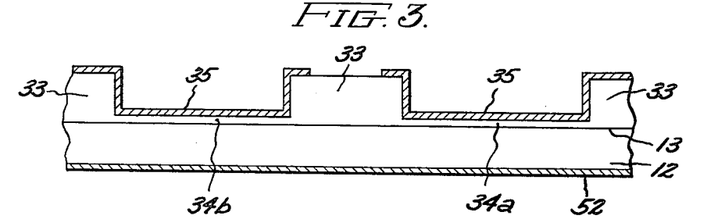
FIG. 3 is a sectional view of the apparatus of FIG. 1 taken along section lines 3—3 thereof.
Figure 4:
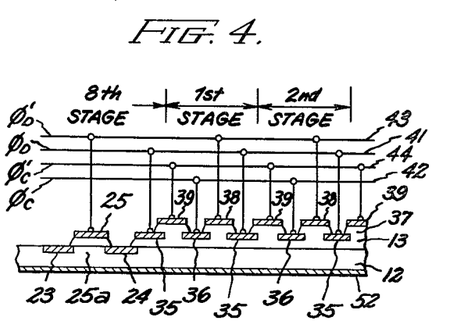
FIG. 4 is a sectional view of the apparatus of FIG. 1 taken along section lines 4—4 thereof.

If additional impulses of charge were applied to the first shift register 15, each of the outputs would be the same as shown in FIG. 6 except shifted in time. Also, if an impulse of charge were applied to the second shift register 17, while applying no signal to the first shift register 15, the output obtained would be the same as shown in FIG. 2 except inverted in polarity. Thus, as any input signal applied to the first shift register 15 can be decomposed into a sequence of impulses and also as any input applied to the second shift register 17 can be decomposed into a sequence of impulses, it is apparent that the response of the filter of FIG. 1 to such inputs would be simply the superposition of the responses of the filter to the individual impulses into which the input signals are decomposed. Thus, by convolving the positive weighted components and the negative components of an input signal with the impulse response as shown in FIG. 6, the output from such a filter would be obtained.

Figure 7:
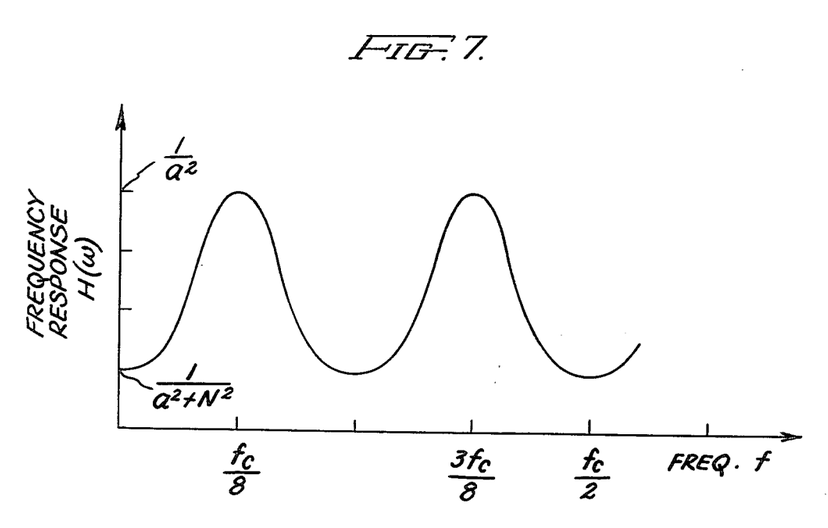
FIG. 7 is a diagram showing the frequency response of the apparatus of FIG. 1.

FIG. 7 shows the transform of the impulse response of FIG. 6 into the frequency domain.

The attenuation constant a will now be derived in terms of the physical structure shown in FIG. 1. First, the fractions of charge division will be determined. The fraction of charge contained in the first storage cell 16a of the first shift register 15 after equilibration with the charge in the first charge storage cell 14a and division thereof described above is a function of the capacitances of the storage cells 16a and 14a. The capacitance $C_1$ of cell 16a is equal to parallel combination of the dielectric capacitances of the storage cell 16b with respect to the overlying clocking electrode, the dielectric capacitance of storage cell 16c with respect to the overlying clocking electrode, the depletion capacitances of cells 16b and 16c, and the depletion capacitance of the regions 23, 23a, and 23b with respect to the substrate. The depletion capacitances are relatively small in relation to the dielectric capacitances of the storage cells 16b and 16c and will be initially ignored. Similarly capacitance $C_2$ of the composite cell 14a of the circulating shift register 11 is equal to the parallel combination of the dielectric capacitances of the two storage cells 14 contiguous to region 24 of opposite conductivity type, the depletion capacitances of these two storage cells 14, and the depletion capacitance of the region 24 of opposite conductivity type with respect to the substrate. The depletion capacitances are relatively small in relation to the dielectric capacitances of the storage cell 14 and will also be initially ignored. As the dielectric capacitance is independent of quantity of charge stored in the storage cells, the proportion of total or combined charge $Q_T$, after equilibration and division of the combined charge, contained in the storage cell 16a is $$\frac{C_1}{C_1 + C_2} Q_T$$

and the proportion of charge contained in storage cell 14a is $$\frac{C_2}{C_1 + C_2} Q_T.$$

Thus, the fraction of the total charge $Q_T$ contained in the storage cell 16a is $$\frac{C_1}{C_1 + C_2},$$

and the fraction of the total charge contained in the storage cell 14a is $$\frac{C_2}{C_1 + C_2}.$$

While depletion capacitance varies with the quantity of charge stored, it can be made largely independent of stored charge as well, if desired. See, for example, patent application Ser. No. 952,413 filed Oct. 18, 1978, assigned to the assignee of the present invention and incorporated hereby by reference thereto. Accordingly, depletion capacitances do not have to be ignored and may be included in the calculation of the fixed fraction, if precise values are desired. Of course, if particular fixed fractions are desired, additional dielectric capacitance may be added to the capacitance of either storage cell 16a or 14a.

Consider the response of the apparatus when a single charge packet is applied to the first shift register 15. Assume at the beginning of the first clock cycle a quantity of charge $Q_n$ is stored in the first charge storage cell 14 of the first stage of the circular shift register 11. At the end of $$\left(\frac{N}{2}\right)^{th}$$

or fourth clock cycle a quantity $$\left(\frac{C_2}{C_1 + C_2}\right) Q_n$$

remains in the first cell of the fourth stage of the circular shift register. At the end of the $N^{th}$ or eighth clock cycle a quantity of charge $$\left(\frac{C_2}{C_1 + C_2}\right)^2$$

$Q_n$ remains in the first cell of the eighth stage. Thus, $$\left(\frac{C_2}{C_1 + C_2}\right)^2 Q_n = e^{-aT}Q_n, \quad (1)$$

where T is the period of charge in the circular shift register 11 and a is the attentuation constant. Solving equation 1 for a yields:

$$a = \frac{2}{T} \ln \frac{C_1 + C_2}{C_2}$$

or $$a = \frac{2f_c}{N} \ln \frac{C_1 + C_2}{C_2}$$

where $$\frac{N}{f_c} = T.$$

FIG. 7 shows the transform of the impulse response of FIG. 6 into the frequency domain.

While input circuits 22a and 22b are provided to convert an input signal into a positive weighted sequence and a negative weighted sequence for application to the first and second shift registers 15 and 17, if the positive weighted and negative weighted input sequences are in the form sequences of charge packets they may be directly applied to the input sections of the first and second shift registers 15 and 17 without the necessity of converting a signal into positive weighted and negative weighted charge sequences.

To cascade the filter of FIG. 1 with another similarly constituted filter the positive weighted output or collection means 53 would be connected directly to the positive weighted input means, for example a similarly constituted region of opposite conductivity type contiguous to a first storage cell, of the succeeding filter and also the negative weighted output or collection means 53 would be connected directly to the negative weighted input means of the succeeding filter.

While the filter of FIGS. 1-4 has utilized charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices are described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filter with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charges input circuits such as those described above could be used.

The filter apparatus of the present invention may also be implemented in bucket brigade technology; however, such implementation would be less advantageous than in the charge coupled technology shown and described in FIGS. 1-4, as bucket brigade devices are subject to charge transfer inaccuracies which limit their performance.

While the invention has been described in specific embodiments in which single phase clocking systems have been employed, it will be understood that other clocking systems such as multi-phase clocking systems may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. In combination,
  a substrate of semiconductor material having a major surface,
  a circular shift register having N stages, each stage including a respective first charge storage cell adjacent said major surface,
  first means for transferring packets of charge in each of the first charge storage cells of said circular shift register from one first charge storage cell to the respective next first charge storage cell in one direction and at one frequency,
  a first charge transfer and storage means including a first charge storage cell adjacent said major surface,
  means for providing a first sequence of packets of charge, second means for sequentially transferring at said one frequency each of said packets of charge of said first sequence of packets of charge to said first charge storage cell of said first charge transfer and storage means, said first and second means being synchronized to provide storage of charge packets in the first charge storage cells of said first charge transfer and storage means and of said circular shift register over a common interval of time, recurrent at said one frequency, first gating means for combining the charge packet in said first charge storage cell of said first charge transfer and storage means with the charge packet in one of the first charge storage cells of said circular shift register during each of said common intervals of time and for dividing the combined packet of charge into two parts, a first part being stored in the first charge storage cell of said first charge transfer and storage means and a second part being stored in said one first charge storage cell of said circular shift register, said first part being a fixed fraction of the combined charge packet, means for transferring each first part of a respective combined packet of charge out of said first charge storage cell of said first charge storage and transfer means at said one frequency.

2. The combination of claim 1 including a second charge transfer and storage means including a first charge storage cell adjacent said major surface, means for providing a second sequence of packets of charge, third means for transferring at said one frequency each of said packets of charge of said second sequence to said first charge storage cell of said second charge transfer and storage means, said first, second and third means being synchronized to provide storage of charge packets in the first charge storage cells of said first charge transfer and storage means, of said second charge transfer and storage means, and of said circular shift register over a common interval of time, recurrent at said one frequency, said circular shift register including an even number N of stages greater than two with said one first storage cell being located in the $N^{th}$ stage thereof, second gating means for combining the charge packet in said first charge storage cell of said second charge transfer and storage means with the charge packet in the first charge storage cell of the $$\left(\frac{N}{2}\right)^{th}$$

stage of said circular shift register during each of said common intervals of time for dividing the combined packet of charge into two parts, a first part being stored in the first charge storage cell of said second charge transfer and storage means and a second part being stored in said first charge storage cell of said $$\left(\frac{N}{2}\right)^{th}$$

stage of said circular shift register, said first part being said fixed fraction of the combined charge packet, means for transferring at said one frequency each first part of a respective combined packet of charge out of said first charge storage cell of said second charge storage and transfer means, means for deriving an output signal consisting of a series of samples, each of which represents the difference of corresponding charge packets recovered from said second charge transfer and storage means and from said third charge transfer and storage means.

3. In combination, a circular shift register having N stages, each stage including a respective first charge storage cell, first means for transferring charge in one direction and at one frequency in said circular shift register from first charge storage cell to first charge storage cell, a first charge transfer and storage means including a first charge storage cell, means for providing a first input sequence of packets of charge, each packet representing a respective sample of a first input signal, second means for sequentially transferring at said one frequency each of said packets of charge of said first sequence of packets of charge to said first charge storage cell of said first charge transfer and storage means, said first and second transferring means being synchronized to provide storage of charge packets in the first charge storage cells of said first charge transfer and storage means and in the first charge storage cells of said circular shift register over a common interval of time, recurrent at said one frequency, first means for combining the charge packet in said first charge storage cell of said first charge transfer and storage means with the charge packet in one of the first charge storage cells of said circular shift register during each of said common intervals of time and for dividing the combined packet of charge into two parts, a first part being stored in the first charge storage cell of said first charge transfer and storage means and a second part being stored in said one first charge storage cell of said circular shift register, said first part being a fixed fraction of the combined charge packet, means for transferring each first part of a respective combined packet of charge out of said first charge storage cell of said first charge storage and transfer means at said one frequency, whereby a first output sequence of packets is obtained, each packet representing a respective sample of a first output signal.

4. The combination of claim 3 including a second charge transfer and storage means including a first charge storage cell, means for providing a second input sequence of packets of charge, each packet representing a respective sample of a second input signal, third means for transferring at said one frequency each of said packets of charge of said second sequence to said first charge storage cell of said second charge transfer and storage means, said first, second and third transferring means being synchronized to provide storage of charge packets in the first charge storage cells of said first charge transfer and storage means, in the first charge storage cells of said second charge transfer and storage means, and in the first charge storage cells of said circular shift register over a common interval of time, recurrent at said one frequency, said circular shift register including an even number N of stages greater than two with said one first storage cell being located in the $N^{th}$ stage thereof, second means for combining the charge packet in said first charge storage cell of said second charge transfer and storage means with the charge packet in the first charge storage cell of the $$\left(\frac{N}{2}\right)^{th}$$

stage of said circular shift register during each of said common intervals of time and for dividing the combined packet of charge into two parts, a first part being stored in the first charge storage cell of said second charge transfer and storage means and a second part being stored in the first charge storage cell of said $$\left(\frac{N}{2}\right)^{th}$$

stage of said circular shift register, said first part being said fixed fraction of the combined charge packet, means for transferring at said one frequency each first part of a respective combined packet of charge out of said first charge storage cell of said second charge storage and transfer means, whereby a second output sequence of packets is obtained, each packet representing a respective sample of a second output signal.

5. The apparatus of claim 3 in which said plurality of first charge storage cells is formed in a substrate of semiconductor material.

6. The apparatus of claim 3 in which said plurality of first charge storage cells is formed adjacent a major surface of said substrate of semiconductor material.

7. The combination of claim 4
   in which each packet of said first input sequence represents the positive weighted components of an input signal,
   in which each packet of said second input sequence represents the negative weighted components of said input signal,
   in which each packet of first output sequence represents the positive weighted components of an output signal, and
   in which each packet of said second output sequence represents the negative weighted components of said output signal.

8. The combination of claim 4 in which is provided means for deriving an output signal consisting of a series of samples, each of which represents the difference of the magnitude of corresponding charge packets of said first and second output sequences.

* * * * *